(12) United States Patent
Kwon (10) Patent No.: US 12,553,937 B2
(45) Date of Patent: Feb. 17, 2026

(54) METHODS OF TESTING BONDED WIRES ON WIRE BONDING MACHINES

(71) Applicant: Kulicke and Soffa Industries, Inc., Fort Washington, PA (US)

(72) Inventor: Odal Kwon, Fort Washington, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 197 days.

(21) Appl. No.: 18/219,988

(22) Filed: Jul. 10, 2023

(65) Prior Publication Data

US 2024/0014169 A1  Jan. 11, 2024

Related U.S. Application Data

(60) Provisional application No. 63/388,006, filed on Jul. 11, 2022.

(51) Int. Cl.
*G01R 31/28* (2006.01)
*H10W 72/00* (2026.01)

(52) U.S. Cl.
CPC ... *G01R 31/2832* (2013.01); *H10W 72/07531* (2026.01)

(58) Field of Classification Search
CPC .......... G01R 31/2832; H01L 2224/859; H01L 24/745; H01L 24/85; H01L 21/00; H01L 22/00; H01L 23/00; H01L 24/00; H01L 25/00; H01L 2221/00; H01L 2223/00; H01L 2224/00; H01L 2225/00; H01L 2924/00

See application file for complete search history.

(56) References Cited

U.S. PATENT DOCUMENTS

| 2006/0163331 A1* | 7/2006 | Babinetz | H01L 24/85 257/E23.024 |
| 2011/0101073 A1* | 5/2011 | Zhang | B23K 20/005 228/103 |
| 2013/0125390 A1* | 5/2013 | Gillotti | H01L 24/48 29/825 |
| 2014/0246480 A1* | 9/2014 | Gillotti | H01L 22/14 228/102 |

FOREIGN PATENT DOCUMENTS

WO    WO-2009002345 A1 * 12/2008 ............. G01B 21/20

* cited by examiner

*Primary Examiner* — Judy Nguyen
*Assistant Examiner* — Brent J Andrews
(74) *Attorney, Agent, or Firm* — Christopher M. Spletzer, Sr.

(57) ABSTRACT

A method of testing a bonded wire on a wire bonding machine is provided. The method includes the steps of: (a) bonding a portion of a wire to a bonding location using a wire bonding tool on a wire bonding machine to form a bonded portion of the wire; (b) moving the wire bonding tool away from the bonded portion of the wire after step (a) with the wire engaged with the wire bonding tool; and (c) moving the wire bonding tool along a motion profile after step (b), with the wire engaged with the wire bonding tool to test the wire.

19 Claims, 14 Drawing Sheets

METHODS OF TESTING BONDED WIRES ON WIRE BONDING MACHINES

CROSS-REFERENCE TO RELATED APPLICATION

This application claims the benefit of U.S. Provisional Application No. 63/388,066, filed Jul. 11, 2022, the content of which is incorporated herein by reference.

FIELD

The invention relates to wire bonding operations, and in particular, to methods of testing bonded wires on wire bonding machines.

BACKGROUND

In the processing and packaging of semiconductor devices, wire bonding continues to be a primary method of providing electrical interconnection between two locations within a package (e.g., between a die pad of a semiconductor die and a lead of a leadframe). More specifically, using a wire bonder (also known as a wire bonding machine), wire loops are formed between respective locations to be electrically interconnected. The primary methods of forming wire loops are ball bonding and wedge bonding. In forming the bonds between (a) the ends of the wire loop and (b) the bonding location (e.g., a die pad, a lead, etc.) varying types of bonding energy may be used, including, for example, ultrasonic energy, thermosonic energy, thermocompressive energy, amongst others.

Wire loops can become damaged (or otherwise fail) over the life of the workpiece in which they are included. For example, thermal load over the life of a device may affect the reliability of wire loops included in the device.

Thus, it would be desirable to provide improved methods of testing bonded wires prior to end use.

SUMMARY

According to an exemplary embodiment of the invention, a method of testing a bonded wire on a wire bonding machine is provided. The method includes the steps of: (a) bonding a portion of a wire to a bonding location using a wire bonding tool on a wire bonding machine to form a bonded portion of the wire; (b) moving the wire bonding tool away from the bonded portion after step (a) with the wire engaged with the wire bonding tool; and (c) moving the wire bonding tool along a motion profile after step (b), with the wire engaged with the wire bonding tool to test the wire.

According to another exemplary embodiment of the invention, a method of testing a plurality of bonded wires on a wire bonding machine is provided. The method includes the steps of: (a) bonding a portion of a wire to a bonding location using a wire bonding tool on a wire bonding machine to form a bonded portion of the wire; (b) forming at least a portion of a wire loop shape while moving the wire bonding tool away from the bonded portion of the wire with the wire engaged with the wire bonding tool after step (a); (c) moving the wire bonding tool along a motion profile after step (b) with the wire engaged with the wire bonding tool to test the wire; and (d) repeating steps (a)-(c) to generate test data related to the wire loop shape.

According to yet another exemplary embodiment of the invention, another method of testing a plurality of bonded wires on a wire bonding machine is provided. The method includes the steps of: (a) bonding a portion of a wire to a bonding location using a wire bonding tool on a wire bonding machine to form a bonded portion of the wire; (b) forming at least a portion of a wire loop shape while moving the wire bonding tool away from the bonded portion of the wire with the wire engaged with the wire bonding tool after step (a); (c) moving the wire bonding tool along a motion profile after step (b) with the wire engaged with the wire bonding tool to test the wire; (d) repeating steps (a)-(c) with the wire loop shape to generate test data related to the wire loop shape; (e) repeating steps (a)-(d) for a plurality of additional wire loop shapes, wherein the wire loop shape and the plurality of additional wire loop shapes are included in a plurality of wire loop shapes; and (f) selecting one of the plurality of wire loop shapes based on predetermined criteria to be used in a subsequent wire bonding operation after step (e).

The methods of the present invention may also be embodied as an apparatus (e.g., as part of the intelligence of a wire bonding machine), or as computer program instructions on a computer readable carrier (e.g., a computer readable carrier including a wire bonding program used in connection with a wire bonding machine).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

In accordance with various exemplary aspects of the invention, features are provided for performing an "on-bonder" simulation, for example, related to bonded wire reliability and/or robustness. In a specific example, a simulation of a thermal reliability test may be performed. As will be appreciated by those skilled in the art, simulating a thermal reliability test (or another test of bonded wires) will tend to save time compared to running actual thermal reliability tests. For example, a bond head of a wire bonding machine may follow a motion profile (e.g., XY cycling movement of the bond head) to simulate expansion and contraction in thermal cycling to test bonded wires (e.g., to test the bonded wire strength).

Figure 1A:
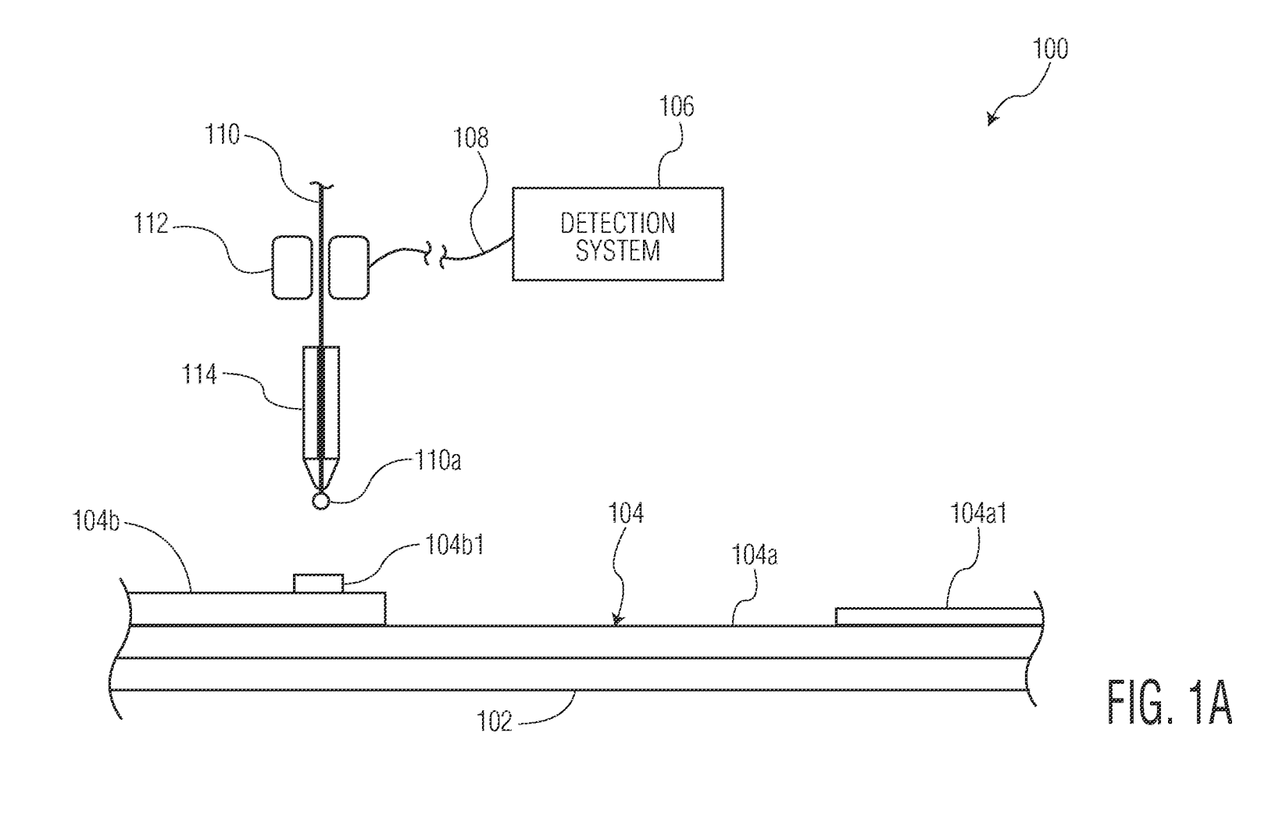
FIGS. 1A-1H are block diagram views illustrating a method of testing bonded wires on a wire bonding machine in accordance with an exemplary embodiment of the invention.

FIGS. 1A-1H illustrate a method of testing a bonded wire on a wire bonding machine 100. FIG. 1A is a block diagram illustrating wire bonding machine 100. Wire bonding machine 100 includes a support structure 102, a detection system 106, a wire clamp 112 (connected to detection system 106 via electrical connection 108), and a wire bonding tool 114 (e.g., a capillary). As will be appreciated by those skilled in the art, wire bonding tool 114 is typically carried by a bond head of wire bonding machine 100. Such a bond head (also known as a bond head assembly) is configured for movement along a plurality of axes (e.g., along the x-axis of the wire bonding machine, along the y-axis of the wire bonding machine, etc.). In FIG. 1A, wire clamp 112 is shown in an open position. A workpiece 104 is shown supported by support structure 102. Wire bonding tool 114 is shown engaged with a wire 110. Specifically, wire 110 is shown passing through wire clamp 112 and wire bonding tool 114. Wire 110 includes a wire end portion 110a (e.g., a free air ball). Workpiece 104 includes a substrate 104a (e.g., a lead frame, a printed circuit board, etc.) with a substrate bonding location 104a1 (e.g., a lead, a contact, a conductive trace, etc.). Workpiece 104 also includes a semiconductor die 104b with a die bonding location 104b1 (e.g., a die pad). Semiconductor die 104b is attached to substrate 104a.

As will be appreciated by those skilled in the art, detection system 106 detects if bonded portions of wire are properly attached to their respective bonding locations (e.g., bond pads, leads, contacts, traces, etc.). For example, wire bonding machines marketed by Kulicke and Soffa Industries, Inc. often utilize a "BITS" process (i.e., Bond Integrity Test System) in connection with such a detection system to confirm that proper wire bonds have been formed. Exemplary details of such processes are disclosed in International Patent Application Publication WO 2009/002345 which is incorporated by reference herein in its entirety. Detection system 106 may detect if a bonded portion of a wire is properly attached to a bonding location via an electric continuity check (e.g., testing electrical continuity between wire clamp 112 and a bonding location). Additional details are described below; however, it is understood that other types of detection systems may be utilized (e.g., optical inspection systems for detecting if a portion of a wire is properly attached to a bonding location).

Figure 1B:
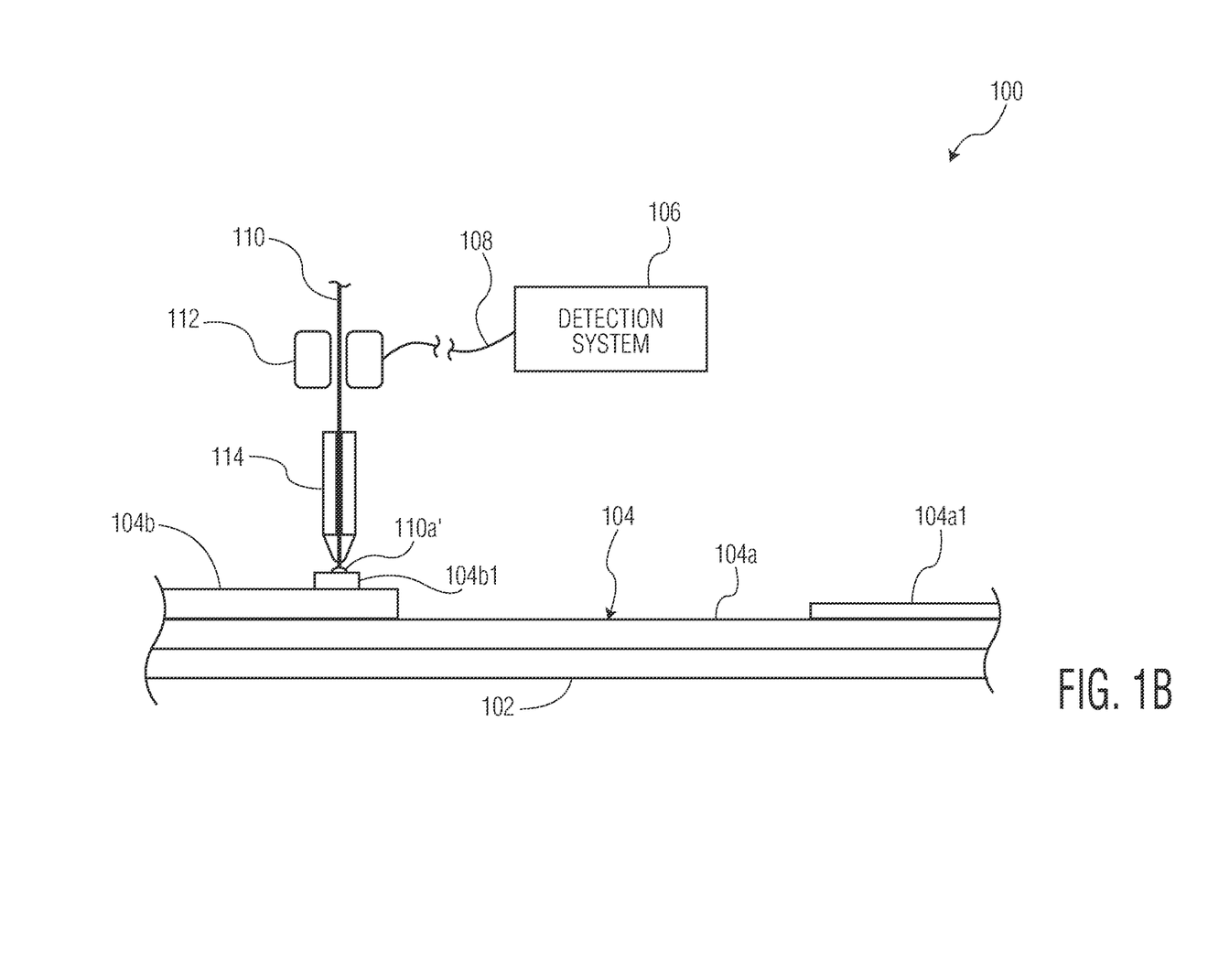

FIG. 1B illustrates bonding of wire end portion 110a to die bonding location 104b1. Specifically, wire bonding tool 114 has been moved downward such that wire end portion 110a is bonded to die bonding location 104b1 on semiconductor die 104b (e.g., using ultrasonic bonding, thermosonic bonding, etc.). Once wire end portion 110a is bonded to die bonding location 104b1, wire 110 includes a bonded portion 110a'.

Figure 1C:
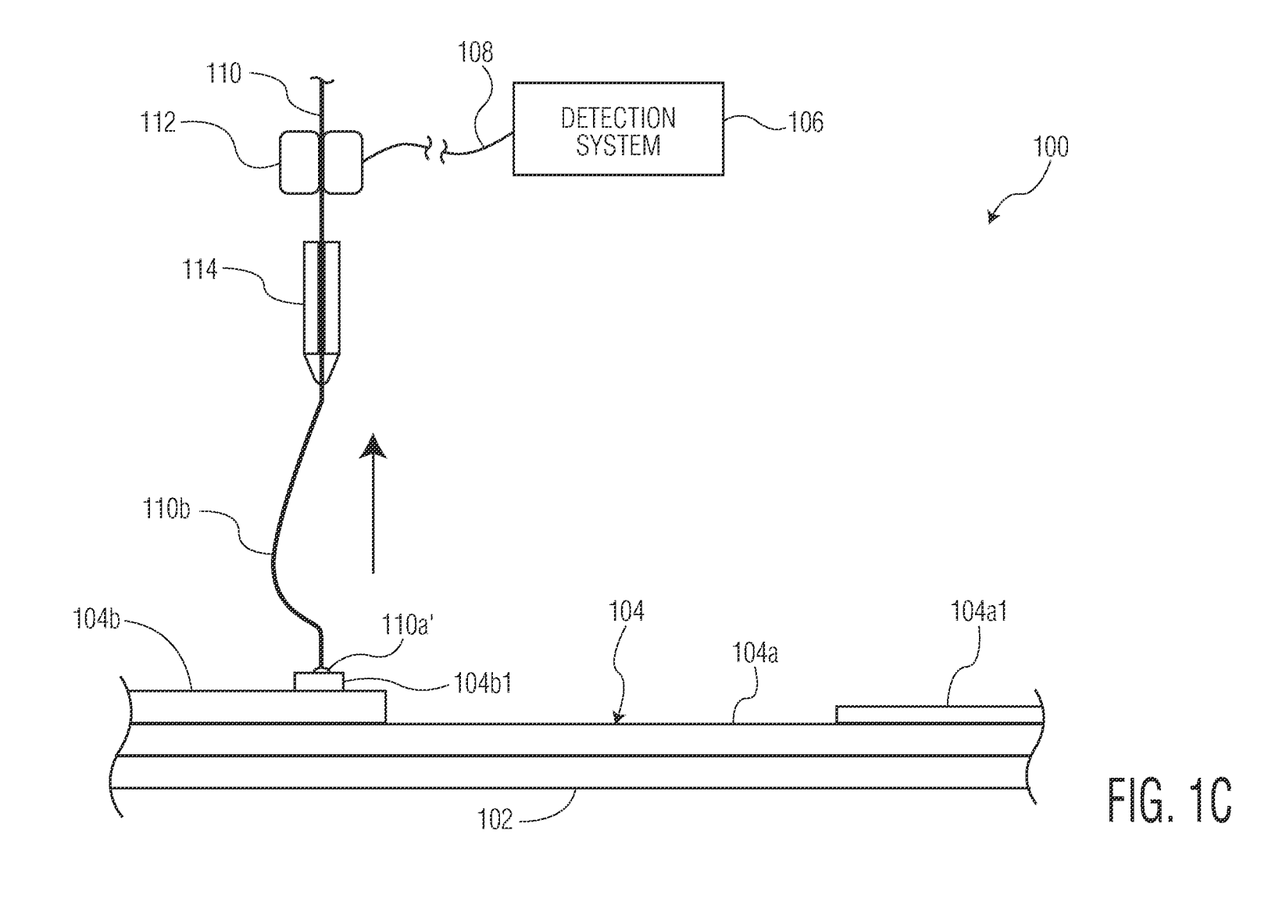

FIG. 1C illustrates moving wire bonding tool 114 away from bonded portion 110a' (while wire 110 is still continuous with bonded portion 110a'), with wire 110 still engaged with wire bonding tool 114. A length of wire 110b is thereby provided between the bonded portion 110a' and wire bonding tool 114. Although the arrow shown in FIG. 1C may suggest that wire bonding tool 114 moved straight up from bonded portion 110a', it should be understood that the invention is not so limited. In fact, a non-direct path (e.g., a nonlinear path, an oscillatory path, a "zigzagged" path, etc.) may be required to form a particular wire loop shape. FIG. 1C illustrates an example non-straight wire loop shape (e.g., formed by a non-direct path of wire bonding tool 114); however, other shapes are within the scope of the invention (e.g., see FIGS. 2A-2C). As is understood by those skilled in the art, after moving above bonded portion 110a', various motions may occur in order to shape a portion of a wire loop (e.g., forming kinks or bends in wire 110, feeding a length of wire from a wire source, etc.). After such shaping, FIG. 1C illustrates wire bonding tool 114 in a "top of loop" position, which is a position known to those skilled in the art. After reaching this position (or another position away from bonded portion 110a'), wire clamp 112 may be closed. With wire clamp 112 closed, detection system 106 may be used to detect electric continuity through wire clamp 112, wire 110 (including bonded portion 110a'), and die bonding location 104b1.

Figure 1D:
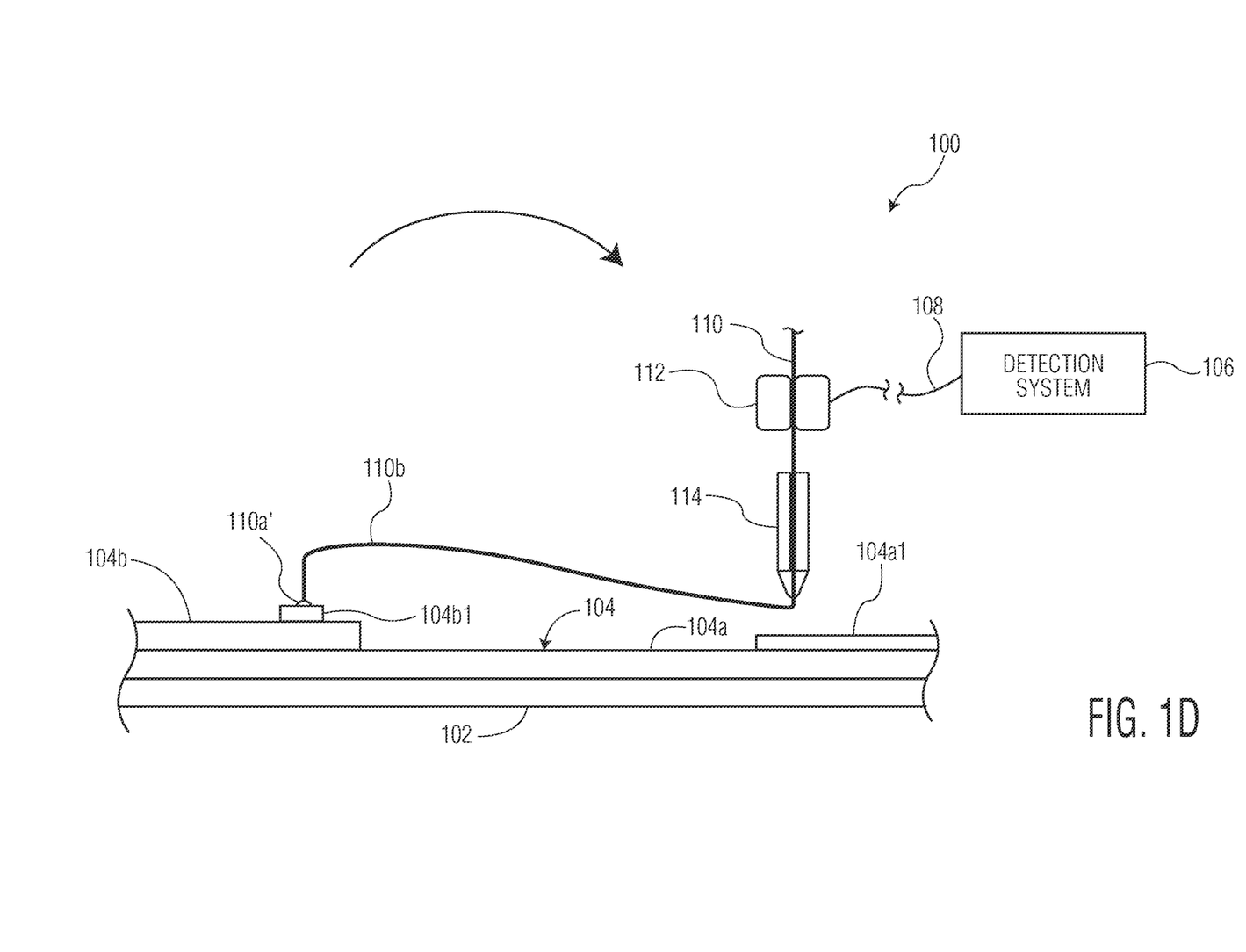

FIG. 1D illustrates a further motion away from bonded portion 110a'. In the example shown, wire bonding tool 114 moves from the position of FIG. 1C (e.g., a top of loop position) to a position close to (e.g., directly above) substrate bonding location 104a1. Detection system 106 may continue to monitor continuity between wire clamp 112 and die bonding location 104b1 (via wire 110).

Figure 1E:
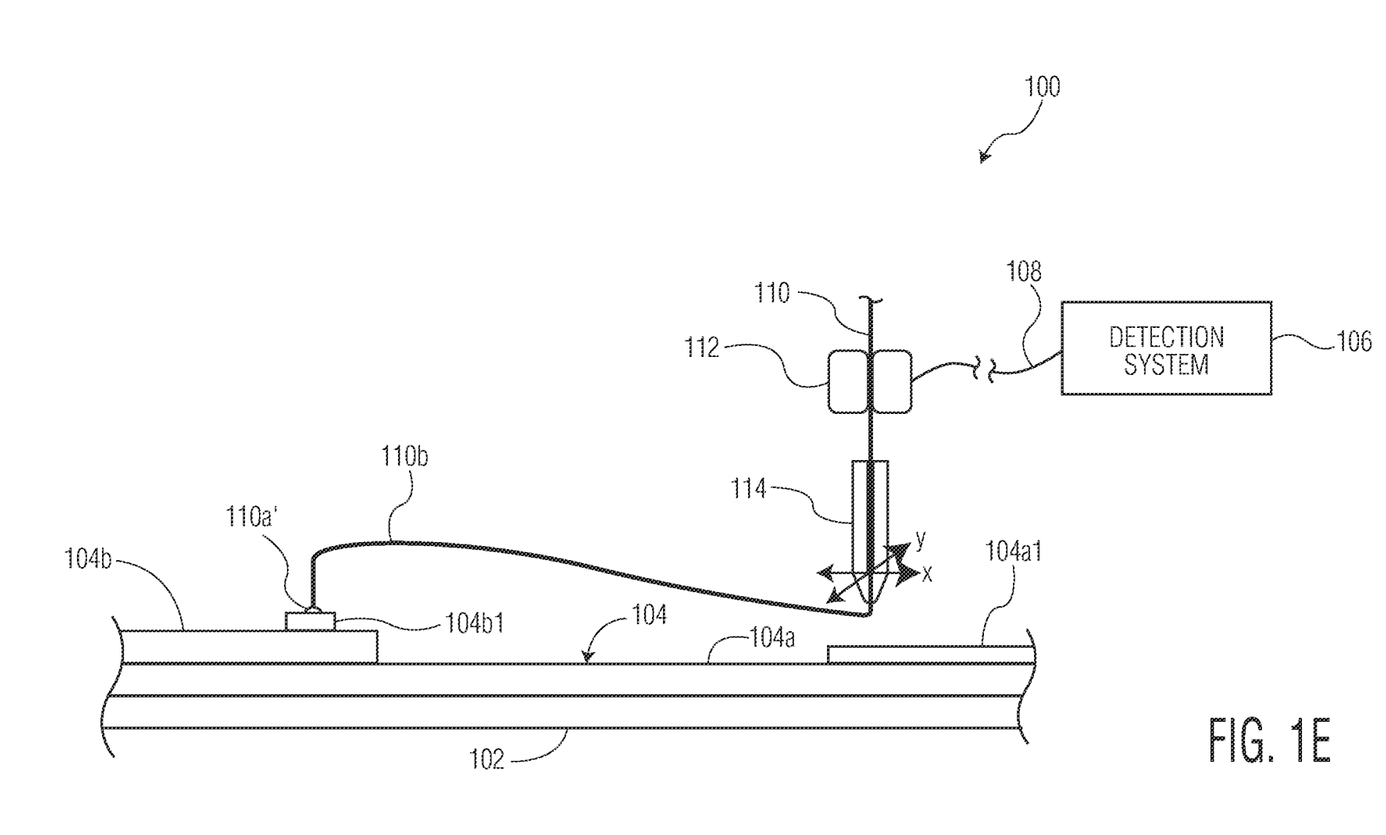

In FIG. 1E, at this position above substrate bonding location 104a1, wire bonding tool 114 is moved along a motion profile (e.g., where a bond head of the wire bonding machine, not shown, is used to move wire bonding tool 114). For example, such a motion profile may be executed at a position above a second bonding location (e.g., above substrate bonding location 104a1). Of course, the position of the motion profile is not so limited.

The motion profile may take place in only one direction (e.g., a single motion repeated a number of times, that is, for a particular number of cycles), or a plurality of directions. In one example, the motion profile may be an oscillation with an amplitude and frequency in a single direction (e.g., along the x-axis of a wire bonding machine, along a y-axis of a wire bonding machine, along the direction that a wire loop extends, etc.). In another example, the motion profile may include motions in a plurality of directions (e.g., motion along multiple horizontal axes of a wire bonding machine). In yet another example, the motion profile may include non-linear motions (e.g., circular motions, oscillatory motions, "zigzagged" motions, etc.). In yet another example, the motion profile may include vertical motions (e.g., motions along a z-axis of a wire bonding machine). Further still, the motion profile can include combinations of different motions (e.g., different amplitudes, different frequencies, different directions, etc.).

In one specific example, a motion profile could include a one-dimensional oscillation at a fixed amplitude and frequency, followed by another oscillation at a different amplitude and frequency. In another specific example, a motion profile could include a one-dimensional oscillation at a fixed amplitude and frequency, followed by a circular motion in the x-y plane at a different amplitude and frequency. A motion profile may include a plurality of other motion profiles nested within one another. Thus, the term "motion profile" as used herein is not limited to any specific motions.

In the example shown in FIG. 1E, the motion profile is intended to include motions within an x-y plane of wire bonding machine 100 (e.g., see the x and y axis symbols). In FIG. 1E, wire 110 is engaged in wire bonding tool 114.

The motion profile may be selected based on a desired test condition. For example, in one embodiment, the motion profile may be configured to simulate an impact condition (e.g., a drop test) to confirm the robustness of wire loop shape. In another embodiment, the motion profile may be configured to simulate an anticipated thermal load seen by a workpiece, to confirm the robustness of wire loop shape. In yet another embodiment, the motion profile may be selected to test a reliability of the wire loop shape (e.g., reliability against a lifetime of drop tests, reliability against thermal cycling, reliability against corrosion, etc.).

Figure 1F:
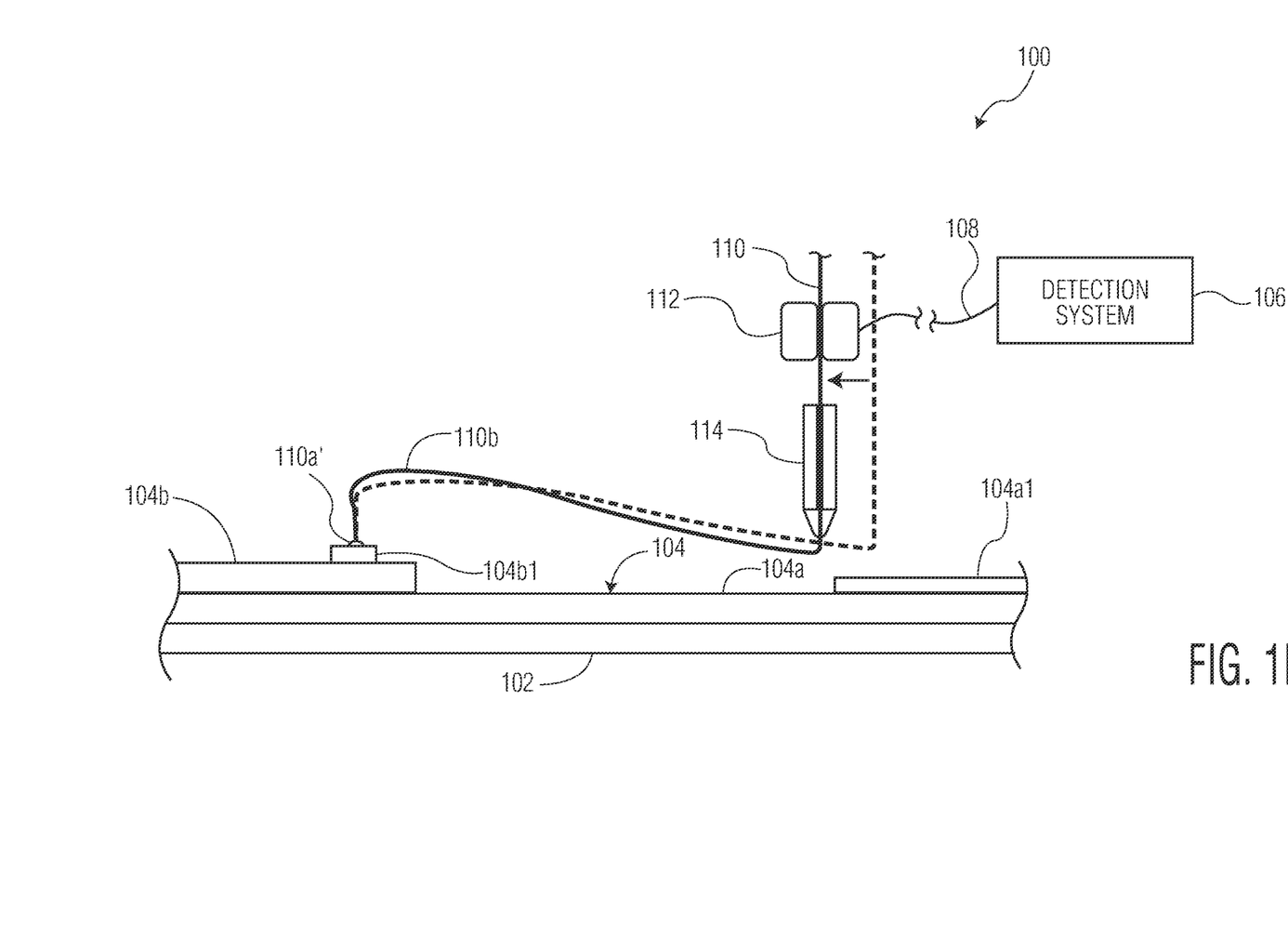
Figure 1G:
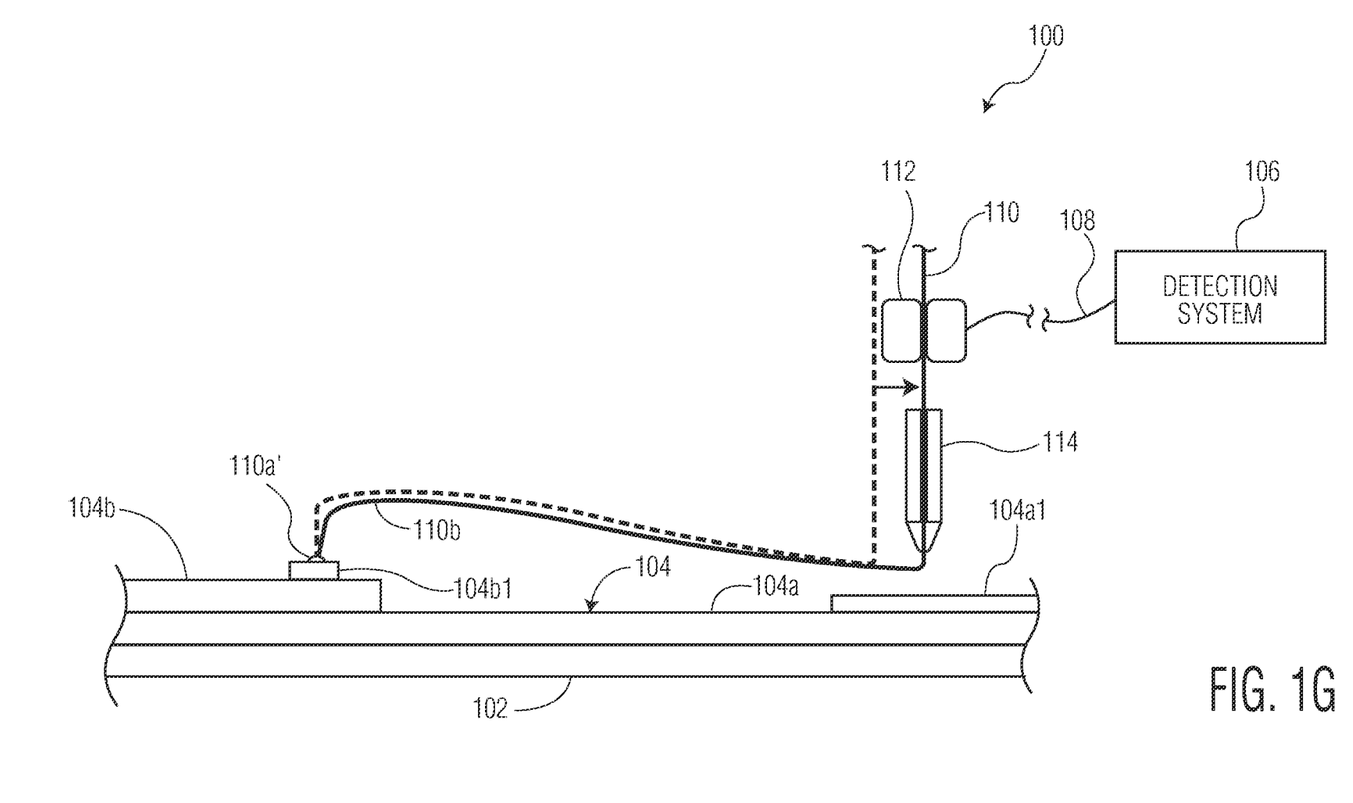

Specifically, in an embodiment wherein the motion profile is selected at least partially based on an anticipated thermal load, experimental data may be collected from extreme heating and cooling of a workpiece, wherein that data collection may take a substantial amount of time. In order to perform a thermal load test more quickly, the motion profile may be determined to simulate the reaction of the wire loop shape to the thermal load experimental data. In FIGS. 1F-1G, an exemplary motion profile having a one-dimensional amplitude and frequency is shown, where a dashed line is illustrated representing a previous position of length of wire 110b and/or wire 110. FIG. 1F illustrates stress put on (at least a portion of) length of wire 110b and/or wire 110; thus, (at least a portion of) length of wire 110b and/or wire 110 can be described as being in a state of compression (or at least a partial state of compression). FIG. 1G illustrates stress put on (at least a portion of) length of wire 110b and/or wire 110; thus, (at least a portion of) length of wire 110b and/or wire 110 can be described as being in a state of tension (or at least a partial state of tension). Although FIGS. 1F-1G show a one-dimensional motion profile, the invention is not limited thereto.

Figure 1H:
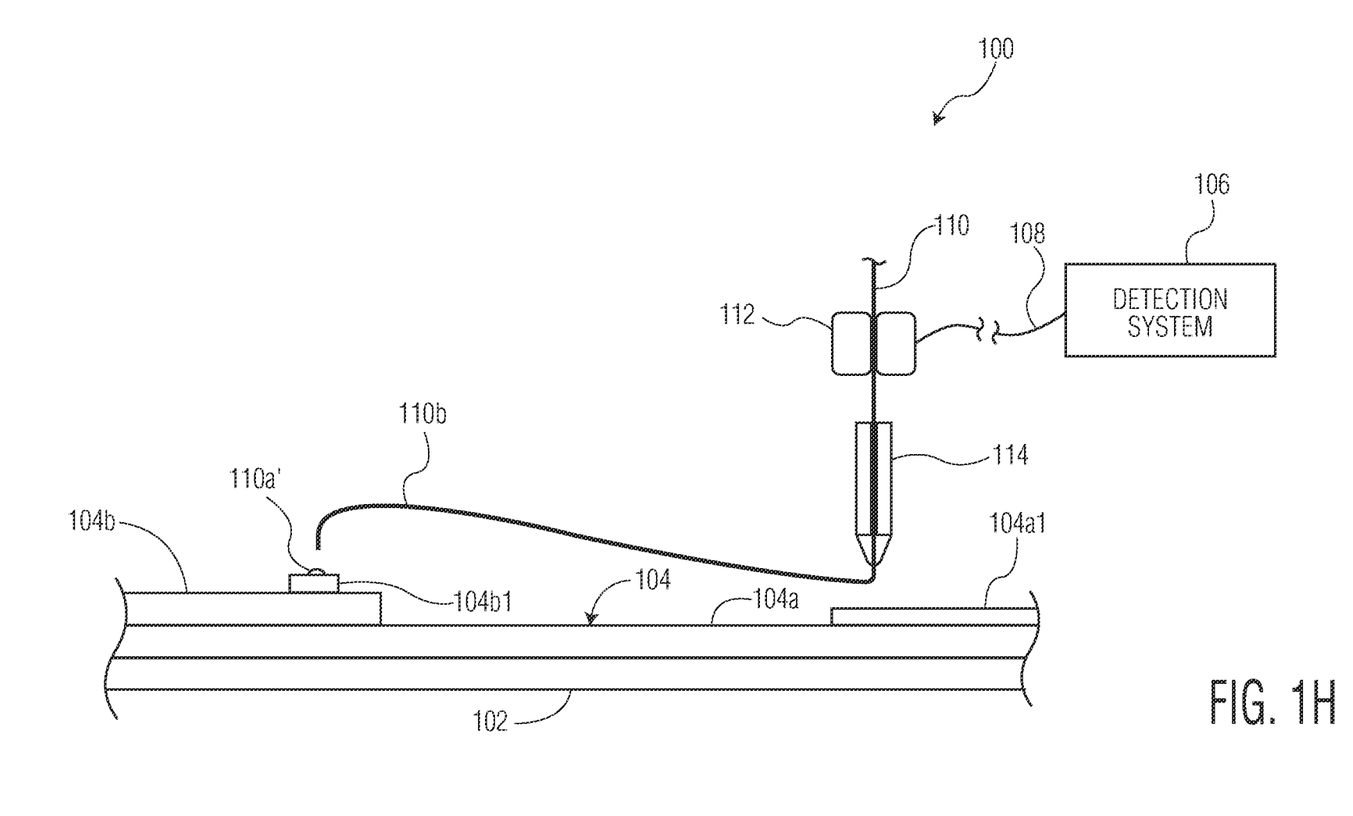

FIG. 1H illustrates a completed bonded wire test. In this particular example, wire 110 broke adjacent bonded portion 110a' (at the "neck" of the bonded wire, above bonded portion 110a'). The break in wire 110 may be detected by detection system 106 (e.g., via BITS, via optical detection, etc.). However, the invention is not limited thereto. The wire may be visually inspected during and/or after the test, either manually (e.g., by an operator) or automatically (e.g., by an optical detection system). Further, damage is not limited to a simple break/no-break observation but could be a detailed analysis of other damage characteristics of wire 110 (e.g., changes in: topography, surface, shape, structure, grain structure, etc.).

Figure 2A:
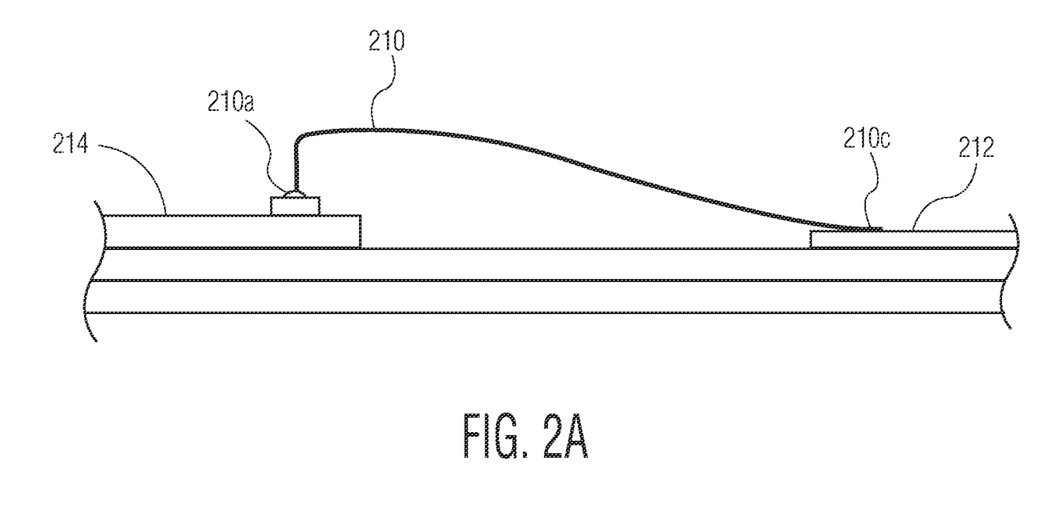
FIGS. 2A-2C are side views of bonded wires illustrating exemplary wire loop shapes that may be tested in accordance with an exemplary embodiment of the invention.
Figure 2B:
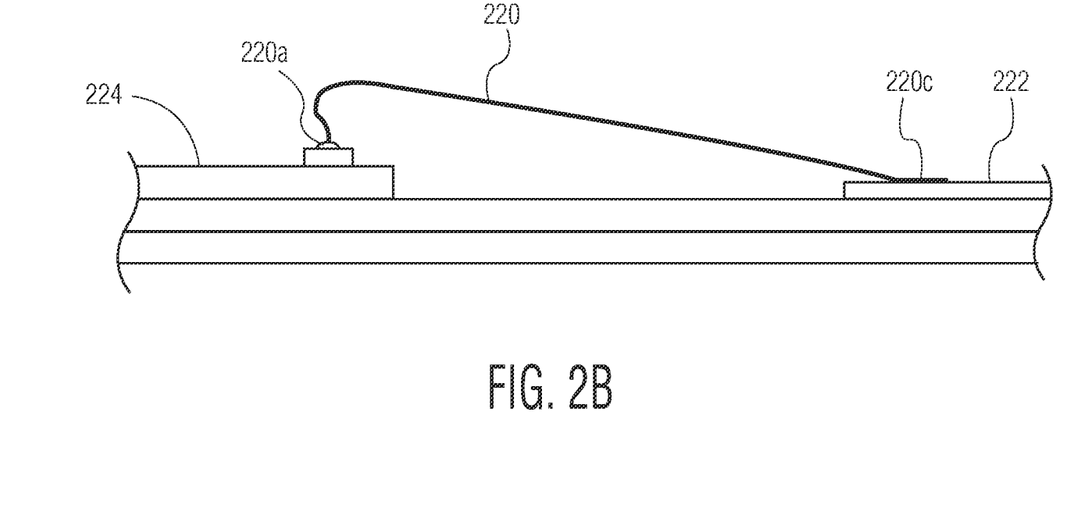
Figure 2C:
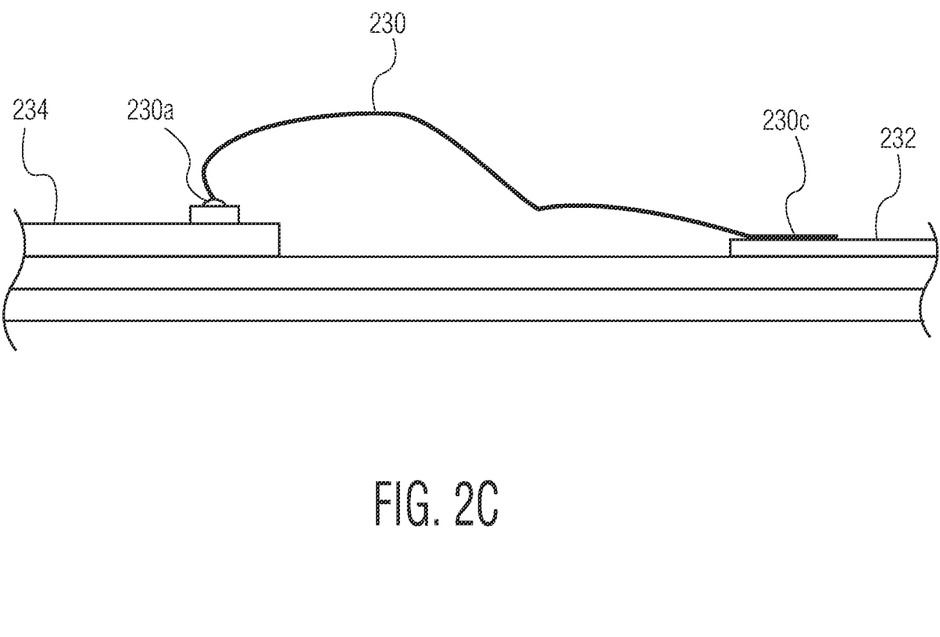

In accordance with various exemplary embodiments of the invention, the methods of testing a bonded wire (such as the method shown in FIGS. 1A-1H) may be repeated for a plurality of wire loop shapes (sometimes referred to as wire loop profiles). By testing multiple wire loop shapes, one of the plurality of wire loop shapes may be selected based on a predetermined criteria (e.g., damage, reliability, robustness, etc.) to be used in subsequent wire bonding operations. FIGS. 2A-2C illustrate three exemplary wire loop shapes to demonstrate the process of testing a plurality of wire loop shapes. A wire loop shape may include any combination of kinks, bends, distances, etc., including a wire loop shape with some or none of the above (e.g., a straight wire). FIG. 2A illustrates a wire loop 210 (including bonded portion 210a and a bonded portion 210c) connecting a bonding location of a semiconductor die 214 to a bonding location of a substrate 212. FIG. 2B illustrates another wire loop 220 (including bonded portion 220a and a bonded portion 220c) connecting a bonding location of a semiconductor die 224 to a bonding location of a substrate 222. FIG. 2C illustrates yet another wire loop 230 (including bonded portion 230a and a bonded portion 230c) connecting a bonding location of a semiconductor die 234 to a bonding location of a substrate 232. These three wire loops each have a distinct wire loop shape (e.g., see shape of wire loops above respective bonded portions 210a, 220a, and 230a; see shapes of wire loops between respective bonding locations; etc.). As one skilled in the art would recognize, additional wire loop shapes including different combinations of kinks, bends, distances, etc. may be tested by an embodiment of the invention.

In accordance with various exemplary embodiments of the invention, predetermined criteria may be utilized to select one wire loop shape versus other wire loop shapes. For example, such predetermined criteria may be related to damage, reliability, and/or robustness resulting from a given wire loop shape. In a specific example, the wire loop shape that performs the best after testing (e.g., the wire loop shape that is least affected by the testing such that the wire does not break or separate from a bonding location) may be selected for use in subsequent wire bonding operations (e.g., a mass production bonding operation). Stated another way, for example, the wire loop shape (e.g., wire loop profile) that is reliable (e.g., does not break) after the greatest number of cycles (e.g., movements in the motion profile) may be selected as the optimized wire loop shape/profile.

Figure 3:
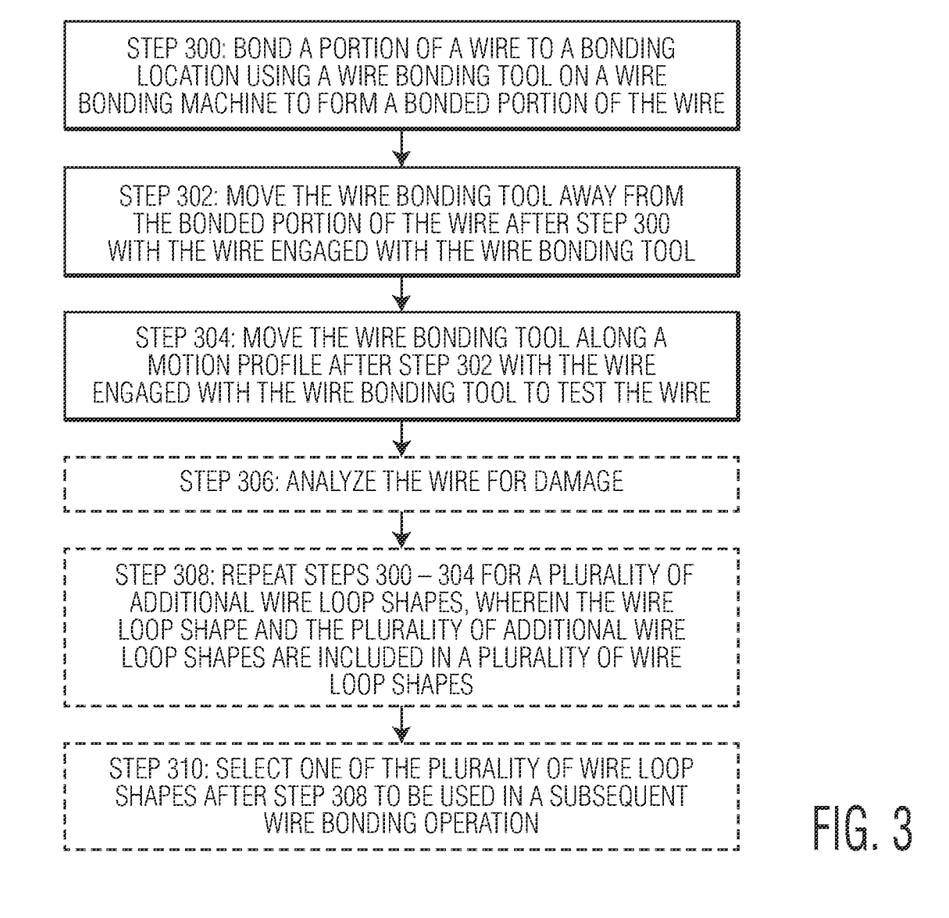
FIG. 3 is a flow diagram illustrating a method of testing a bonded wire on a wire bonding machine in accordance with another exemplary embodiment of the invention.
Figure 4:
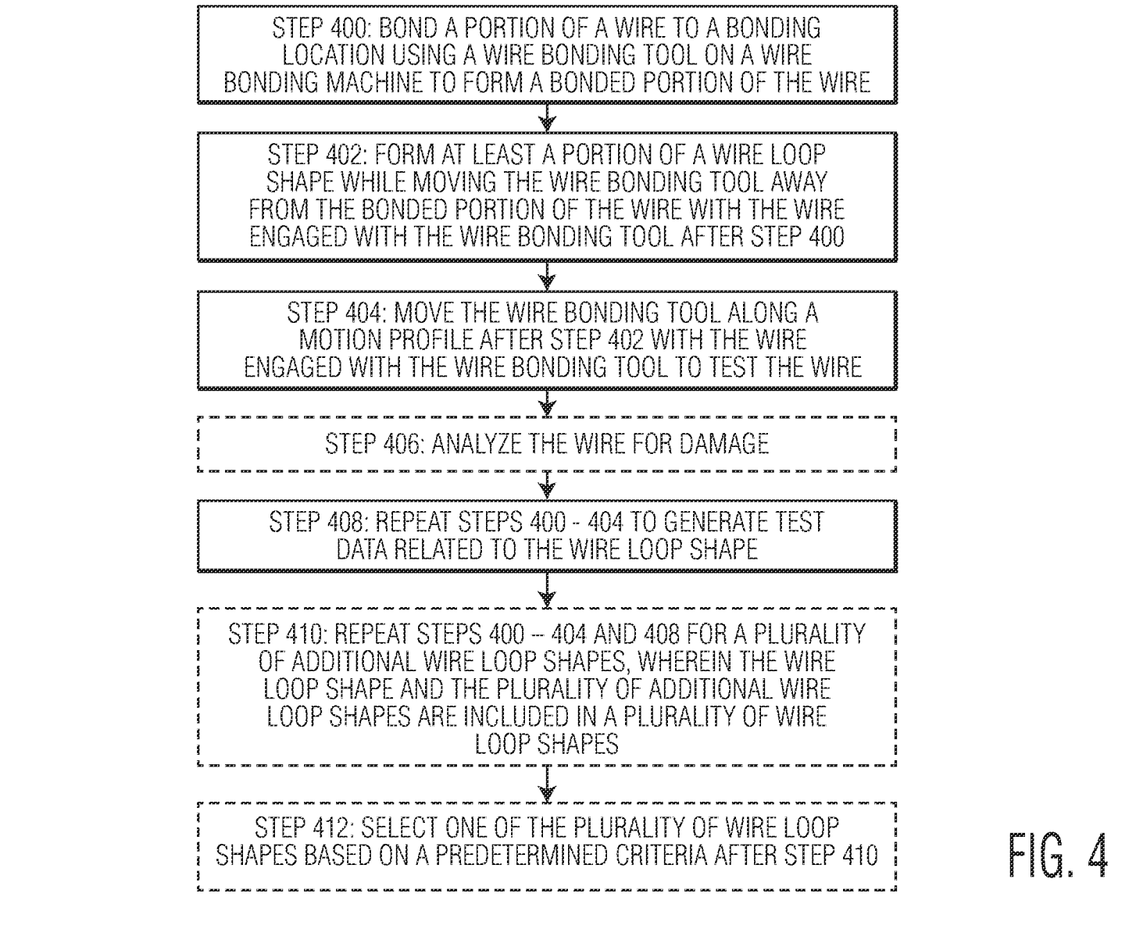
FIG. 4 is a flow diagram illustrating a method of testing a plurality of bonded wires on a wire bonding machine in accordance with yet another exemplary embodiment of the invention.
Figure 5:
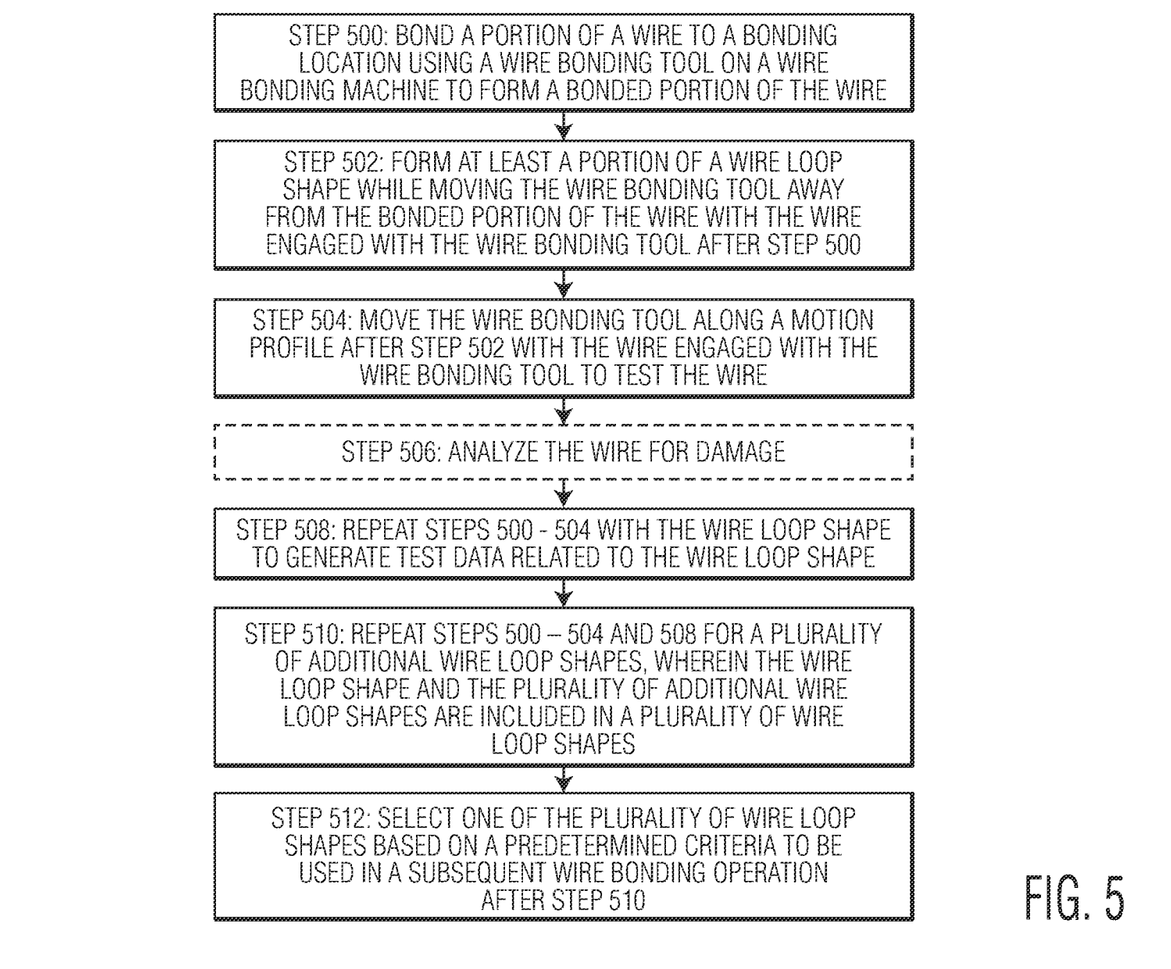
FIG. 5 is a flow diagram illustrating a method of testing a plurality of bonded wires on a wire bonding machine in accordance with yet another exemplary embodiment of the invention.

FIGS. 3-5 are flow diagrams illustrating various embodiments of the invention. As is understood by those skilled in the art, certain steps included in the flow diagrams may be omitted; certain additional steps may be added; and the order of the steps may be altered from the order illustrated—all within the scope of the invention.

FIG. 3 is a flow diagram illustrating an exemplary method of testing a bonded wire on a wire bonding machine. At Step 300, a portion of a wire is bonded to a bonding location using a wire bonding tool on a wire bonding machine to form a bonded portion of the wire (e.g., see FIG. 1B). At Step 302, the wire bonding tool is moved away from the bonded portion of the wire after Step 300 with the wire engaged with the wire bonding tool (e.g., see FIG. 1C). At Step 304, the wire bonding tool is moved along a motion profile after Step 302 with the wire engaged with the wire bonding tool to test the wire (e.g., see FIG. 1E). At optional Step 306, the wire is analyzed for damage (e.g., during at least one of: (i) Step 304; and (ii) a period of time after Step 304). At optional Step 308, Steps 300-306 are repeated for a plurality of additional wire loop shapes (e.g., see FIGS. 2A-2C), wherein the wire loop shape and the plurality of additional wire loop shapes are included in a plurality of wire loop shapes. At optional Step 310, one of the plurality of wire loop shapes is selected after Step 308 to be used in a subsequent wire bonding operation.

FIG. 4 is a flow diagram illustrating an exemplary method of testing a plurality of bonded wires on a wire bonding machine. At Step 400, a portion of wire is bonded to a bonding location using a wire bonding tool on a wire bonding machine to form a bonded portion of the wire (e.g., see FIG. 1B). At Step 402, at least a portion of a wire loop shape is formed (e.g., including one or more bends, kinks, etc.) while moving the wire bonding tool away from the bonded portion of the wire with the wire engaged with the wire bonding tool after Step 400 (e.g., see wire loop shaping in FIG. 1C). At Step 404, the wire bonding tool is moved along a motion profile after Step 402 with the wire engaged with the wire bonding tool to test the wire (e.g., see FIG. 1E). At optional Step 406, the wire is analyzed for damage. At Step 408, Steps 400-404 are repeated to generate test data related to the specific wire loop shape. That is, a given wire loop shape (e.g., any one of the wire loop shapes shown in FIGS. 2A-2C, or any other wire loop shape) is tested repeatedly by repeating steps 400-404. In another embodiment, Steps 400-406 are repeated to generate test data related to the specific wire loop shape. At optional Step 410, Steps 400-404 and 408 are repeated for a plurality of additional wire loop shapes (e.g., see FIGS. 2A-2C), wherein the wire loop shape and the plurality of additional wire loop shapes are included in a plurality of wire loop shapes. In another embodiment, Steps 400-408 are repeated for a plurality of additional wire loop shapes wherein the wire loop shape and the plurality of additional wire loop shapes are included in a plurality of wire loop shapes. At optional Step 412, one of the plurality of wire loop shapes is selected based on predetermined criteria after Step 410.

FIG. 5 is a flow diagram illustrating an exemplary method of testing a plurality of bonded wires on a wire bonding machine. At Step 500, a portion of wire is bonded to a bonding location using a wire bonding tool on a wire bonding machine to form a bonded portion of the wire (e.g., see FIG. 1B). At Step 502, at least a portion of a wire loop shape (e.g., including one or more bends, kinks, etc.) is formed while moving the wire bonding tool away from the bonded portion of the wire with the wire engaged with the wire bonding tool after Step 500 (e.g., see wire loop shaping in FIG. 1C). At Step 504, the wire bonding tool is moved along a motion profile after Step 502 with the wire engaged with the wire bonding tool to test the wire (e.g., see FIG. 1E). At optional Step 506, the wire is analyzed for damage. At Step 508, Steps 500-504 are repeated to generate test data related to the specific wire loop shape. That is, a given wire loop shape (e.g., any one of the wire loop shapes shown in FIGS. 2A-2C, or any other wire loop shape) is tested repeatedly by repeating steps 500-504. In another embodiment, Steps 500-506 are repeated to generate test data related to the specific wire loop shape. At Step 510, Steps 500-504 and 508 are repeated for a plurality of additional wire loop shapes, wherein the wire loop shape and the plurality of additional wire loop shapes are included in a plurality of wire loop shapes. In another embodiment, Steps 500-508 are repeated for a plurality of additional wire loop shapes wherein the wire loop shape and the plurality of additional wire loop shapes are included in a plurality of wire loop shapes. At Step 512, one of the plurality of wire loop shapes is selected based on a predetermined criteria to be used in a subsequent wire bonding operation after Step 510.

Although the invention is described and illustrated herein with reference to selecting a wire loop shape to be used in a subsequent bonding operation, the invention is not limited thereto. It is contemplated that the method may be used to select other characteristics related to a wire rather than a wire loop shape (e.g., a wire material, a wire diameter, etc.).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method comprising the steps of:
   (a) bonding a portion of a wire to a bonding location using a wire bonding tool on a wire bonding machine to form a bonded portion of the wire;
   (b) moving the wire bonding tool away from the bonded portion of the wire after step (a) with the wire engaged with the wire bonding tool, wherein step (b) includes forming at least a portion of a wire loop shape while moving the wire bonding tool away from the bonded portion;
   (c) moving the wire bonding tool along a motion profile after step (b) with the wire engaged with the wire bonding tool to test the wire by putting stress on the wire, wherein the motion profile includes oscillation in one or more directions, the one or more directions including (i) along an x-axis of the wire bonding machine, (ii) along a y-axis of the wire bonding machine, or (iii) along a direction that a wire loop extends; and
   (d) analyzing the wire for damage during at least one of (i) step (c) and (ii) a period of time after step (c).

2. The method of claim 1 wherein step (c) includes moving the wire bonding tool along the motion profile at a position above a second bonding location configured to receive another portion of the wire.

3. The method of claim 1 wherein each of steps (a)-(c) are repeated for a plurality of additional wire loop shapes, wherein the wire loop shape and the plurality of additional wire loop shapes are included in a plurality of wire loop shapes.

4. The method of claim 3 further comprising a step of selecting one of the plurality of wire loop shapes after repeating each of steps (a)-(c) to be used in a subsequent wire bonding operation.

5. The method of claim 4 wherein the one of the plurality of wire loop shapes is selected based on predetermined criteria.

6. The method of claim 1 wherein the motion profile is configured to simulate an anticipated thermal load.

7. The method of claim 1 wherein the motion profile is selected to test a reliability of the wire loop shape.

8. The method of claim 1 wherein step (c) is provided for performing an on-bonder simulation related to bonded wire reliability or robustness.

9. The method of claim 1 further comprising a step of determining whether the wire breaks during step (c).

10. The method of claim 1 wherein the motion profile includes a plurality of motions within an x-y plane of the wire bonding machine.

11. The method of claim 1 wherein the motion profile includes moving along a path for a plurality of cycles.

12. The method of claim 1 wherein the motion profile includes an amplitude component and a frequency component.

13. A method comprising the steps of:
   (a) bonding a portion of a wire to a bonding location using a wire bonding tool on a wire bonding machine to form a bonded portion of the wire;
   (b) forming at least a portion of a wire loop shape while moving the wire bonding tool away from the bonded portion of the wire with the wire engaged with the wire bonding tool after step (a);
   (c) moving the wire bonding tool along a motion profile after step (b) with the wire engaged with the wire bonding tool to test the wire by putting stress on the wire, wherein the motion profile includes oscillation in one or more directions, the one or more directions including (i) along an x-axis of the wire bonding machine, (ii) along a y-axis of the wire bonding machine, or (iii) along a direction that a wire loop extends;
   (d) repeating steps (a)-(c) to generate test data related to the wire loop shape; and
   (e) analyzing the wire for damage during at least one of (i) step (c) and (ii) a period of time after step (c).

14. The method of claim 13 further comprising a step of repeating steps (a)-(d) for a plurality of additional wire loop shapes, wherein the wire loop shape and the plurality of additional wire loop shapes are included in a plurality of wire loop shapes.

15. The method of claim 14 further comprising the step of selecting one of the plurality of wire loop shapes based on predetermined criteria to be used in a subsequent bonding operation after step (e).

16. The method of claim 15 wherein the predetermined criteria is related to breakage of the wire as a result of step (c).

17. The method of claim 13 wherein the motion profile is configured to simulate an anticipated thermal load.

18. The method of claim 13 wherein the motion profile is selected to test wire loop shape reliability.

19. A method comprising the steps of:
(a) bonding a portion of a wire to a bonding location using a wire bonding tool on a wire bonding machine to form a bonded portion of the wire;
(b) forming at least a portion of a wire loop shape while moving the wire bonding tool away from the bonded portion of the wire with the wire engaged with the wire bonding tool after step (a);
(c) moving the wire bonding tool along a motion profile after step (b) with the wire engaged with the wire bonding tool to test the wire by putting stress on the wire, wherein the motion profile includes oscillation in one or more directions, the one or more directions including (i) along an x-axis of the wire bonding machine, (ii) along a y-axis of the wire bonding machine, or (iii) along a direction that a wire loop extends;
(d) repeating steps (a)-(c) with the wire loop shape to generate test data related to the wire loop shape;
(e) repeating steps (a)-(d) for a plurality of additional wire loop shapes, wherein the wire loop shape and the plurality of additional wire loop shapes are included in a plurality of wire loop shapes;
(f) analyzing the wire for damage during at least one of (i) step (c) and (ii) a period of time after step (c); and
(g) selecting one of the plurality of wire loop shapes based on predetermined criteria to be used in a subsequent wire bonding operation after step (e).

* * * * *